(12) United States Patent
Scott et al.

(10) Patent No.: US 11,038,472 B2
(45) Date of Patent: Jun. 15, 2021

(54) POWER AMPLIFIER SYSTEM

(71) Applicant: Qorvo US, Inc., Greensboro, NC (US)

(72) Inventors: Baker Scott, San Jose, CA (US);
George Maxim, Saratoga, CA (US);
Toshiaki Moriuchi, San Jose, CA (US);
Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 38 days.

(21) Appl. No.: 16/416,816

(22) Filed: May 20, 2019

(65) Prior Publication Data

US 2020/0373888 A1    Nov. 26, 2020

(51) Int. Cl.
| | | |
|---|---|---|
| H03F 3/04 | (2006.01) | |
| H03F 1/30 | (2006.01) | |
| H03F 3/24 | (2006.01) | |
| H03G 3/30 | (2006.01) | |
| H04B 1/04 | (2006.01) | |
| H03F 3/193 | (2006.01) | |

(52) U.S. Cl.
CPC ........... *H03F 1/306* (2013.01); *H03F 3/1935* (2013.01); *H03F 3/245* (2013.01); *H03G 3/3042* (2013.01); *H04B 1/04* (2013.01)

(58) Field of Classification Search
CPC ........ H03F 1/306; H03F 3/245; H03F 3/1935; H04B 1/04; H03G 3/3042
USPC ......................................... 330/296, 285, 302
See application file for complete search history.

(56) References Cited

U.S. PATENT DOCUMENTS 6,891,438 B2 *   5/2005   Arai ...................... H03F 1/0261
330/136

* cited by examiner

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

A power amplifier system having a power amplifier with a signal input and a signal output and bias circuitry is disclosed. The bias circuitry includes a bandgap reference circuit coupled between a reference node and a fixed voltage node. A bias generator has a bias input coupled to the reference node and a bias output coupled to the signal input. Also included is a first digital-to-analog converter having a first converter output coupled to the reference node, a first voltage input, and a first digital input, wherein the first digital-to-analog converter is configured to adjust a reference voltage at the reference node in response to a first digital setting received at the first digital input. The first digital setting correlates with an indication of temperature of the power amplifier.

19 Claims, 6 Drawing Sheets

POWER AMPLIFIER SYSTEM

FIELD OF THE DISCLOSURE

The disclosure relates generally to power amplifier systems of radio frequency transmitters and in particular to power amplifier systems that provide bias signals for amplifiers over a wide range of temperature.

BACKGROUND

A power amplifier is used to amplify radio frequency signals to be transmitted from an antenna of a wireless device such as a mobile telephone. A number of conventional power amplifiers employ bias circuitry that provides an inadequate bias signal level when the radio frequency signals reach a peak power level. As such, these conventional power amplifiers often suffer from output signal distortion at peak power levels. For example, the inadequate bias signal level results in amplitude modulation-amplitude modulation distortion that can cause an out-of-specification adjacent channel leakage ratio. Thus, a power amplifier system having a bias circuitry that provides adequate bias signal levels over a wide range of input power levels and associated temperature changes is needed.

SUMMARY

A power amplifier system having a power amplifier with a signal input and a signal output and bias circuitry is disclosed. The bias circuitry includes a bandgap reference circuit coupled between a reference node and a fixed voltage node. A bias generator has a bias input coupled to the reference node and a bias output coupled to the signal input. Also include is a first digital-to-analog converter having a first converter output coupled to the reference node, a first voltage input, and a first digital input, wherein the first digital-to-analog converter is configured to adjust a reference voltage at the reference node in response to a first digital setting received at the first digital input.

In exemplary embodiments, the power amplifier system further includes a controller having a communication port in communication with the first digital input of the first digital-to-analog converter and a digital processor in communication with the communication port. The digital processor is configured to receive an indication of temperature of the power amplifier through the communication port, generate the first digital setting correlating with the indication of temperature of the power amplifier, and send the first digital setting through the communication port to the first digital input of the first digital-to-analog converter.

Other exemplary embodiments include a second digital-to-analog converter having a second converter output coupled to the first voltage input, and a second digital input, wherein the second digital-to-analog converter is configured to adjust voltage at the first voltage input in response to a second digital setting received at the second digital input. In these exemplary embodiments, the digital processor is further configured to receive the indication of temperature of the power amplifier through the communication port, generate the second digital setting correlating with the indication of temperature of the power amplifier, and send the second digital setting through the communication port to the second digital input of the second digital-to-analog converter.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
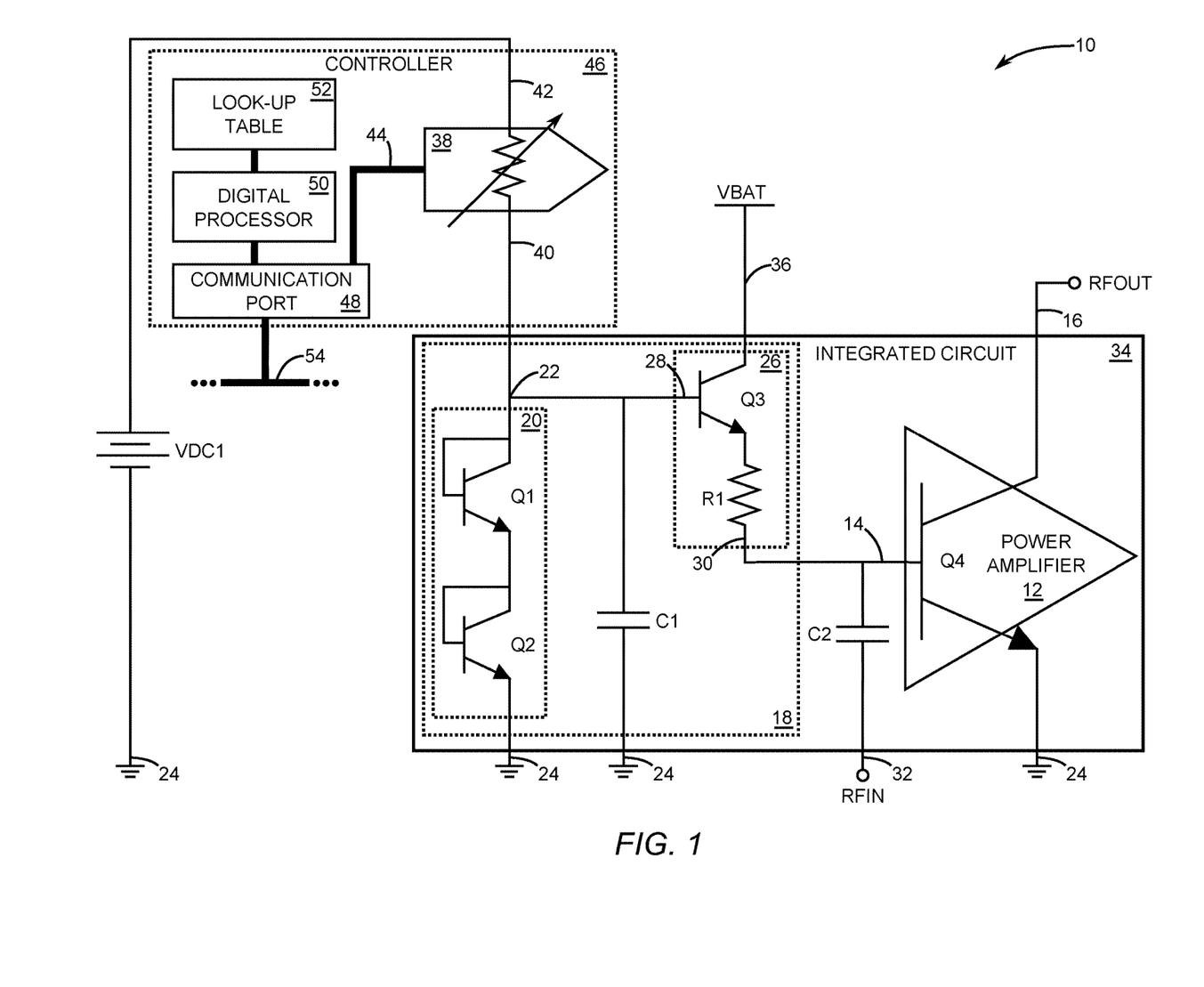
FIG. 1 is a schematic diagram of a first exemplary embodiment of a power amplifier system that is structured in accordance with the present disclosure.

FIG. 1 is a schematic diagram of a first exemplary embodiment of a power amplifier system 10 that is structured in accordance with the present disclosure. In this first exemplary embodiment, the power amplifier system 10 has a power amplifier 12 with a signal input 14 and a signal output 16 (RFOUT) and bias circuitry 18. The bias circuitry 18 includes a bandgap reference circuit 20 coupled between a reference node 22 and a fixed voltage node 24, and a bias generator 26 has a bias input 28 coupled to the reference node 22. The bias generator 26 has a bias output 30 coupled to the signal input 14 of the power amplifier 12. In at least some embodiments, the power amplifier is based on bipolar junction transistor (BJT) technology.

In this exemplary embodiment, the bandgap reference circuit 20 is made up of a pair of stacked transistors Q1 and Q2 that are BJTs and that are each in a diode configuration. A collector and a base of the transistor Q1 are coupled to the reference node 22, while a collector and a base of the transistor Q2 are coupled to an emitter of transistor Q1. An emitter of the transistor Q2 is coupled to the fixed voltage node 24, which in this case is ground. However, it is to be understood that a desired bias voltage and/or current can also be generated by replacing the pair of stacked transistors Q1 and Q2 with a single transistor, one or more diodes, or combinations thereof. One or more resistors can also be combined with the transistor(s) and/or diode(s) to more particularly refine the desired bias voltage and/or current at the reference node 22. Also, in this exemplary embodiment, the bias generator 26 includes a transistor Q3 that is a BJT and has a base coupled to the bias input 28, and an emitter coupled to the signal input 14 through a resistor R1.

Moreover, a first capacitor C1 is coupled between the reference node 22 and the fixed voltage node 24, which in this exemplary embodiment is ground. The first capacitor C1 filters noise from the voltage at the reference node 22. A second capacitor C2 is coupled between a radio frequency (RF) signal input 32 (RFIN) and the signal input 14 of the power amplifier 12. The second capacitor C2 is a coupling capacitor that couples an RF signal applied to the RF signal input to the signal input 14.

In the exemplary embodiment of the power amplifier system 10 of FIG. 1, the power amplifier 12 and the bias circuitry 18 are integrated into an integrated circuit 34. Power from a battery voltage rail VBAT is supplied to the collector of transistor Q3 through a power input 36. Further still, in this exemplary embodiment, the power amplifier 12 is represented as a single BJT labeled Q4; however, it is to be understood that the power amplifier 12 may include additional transistors to provide increased gain. Moreover, the power amplifier 12 is not limited to a particular amplifier technology.

Also included is a first digital-to-analog converter 38 having a first analog output 40 coupled to the reference node 22, a first analog input 42, and a first digital input 44, wherein the first digital-to-analog converter 38 is configured to adjust a reference voltage at the reference node 22 in response to a first digital setting received at the first digital input 44. In the exemplary embodiment of FIG. 1, the first digital-to-analog converter 38 is of the resistor type that changes a resistance value between the first analog input 42 and the first analog output 40 in response to a digital value of the first digital setting received at the first digital input 44. In this embodiment, a voltage at the first analog input 42 is supplied by a fixed voltage source VDC1.

In the exemplary embodiment of FIG. 1, a controller 46 includes the first digital-to-analog converter 38. The controller 46 further includes a communication port 48, a digital processor 50, and a look-up table 52. The digital processor 50 communicates with a communication bus 54 and the first digital-to-analog converter 38 through the communication port 48. The look-up table 52 is typically stored in memory that is accessed directly by the digital processor 50.

During operation of the exemplary embodiment of FIG. 1, the digital processor 50 receives information passed through the communication port 48 from the communication bus 54, wherein the information is indicative of a current temperature of the power amplifier 12. Generally, the look-up table 52 has a list of data entries indicative of temperatures expected to be experienced by the power amplifier 12 versus first digital settings for the first digital-to analog converter 38. The information may, for example, be a current power level setting for the power amplifier 12. In this case, the look-up table has a list of power level settings versus first digital settings for the first digital-to-analog converter 38. In this exemplary embodiment, the digital processor 50 is configured to retrieve from the look-up table 52 a first digital setting associated with a current power level setting received by the digital processor.

In response to the received current power level setting, the digital processor 50 retrieves from the look-up table 52 a corresponding first digital setting and passes the first digital setting through the communication port 48 to the first digital input 44 of the first digital-to-analog converter 38. In response, the first digital-to-analog converter 38 adjusts the reference voltage at the reference node 22 in response to the first digital setting received at the first digital input 44. As a result, a bias signal generated by the bias circuitry 18 and applied to the signal input 14 of the power amplifier 12 is at a correct level to ensure that the gain of the power amplifier 12 remains appropriate for the current temperature of the power amplifier 12.

Figure 2:
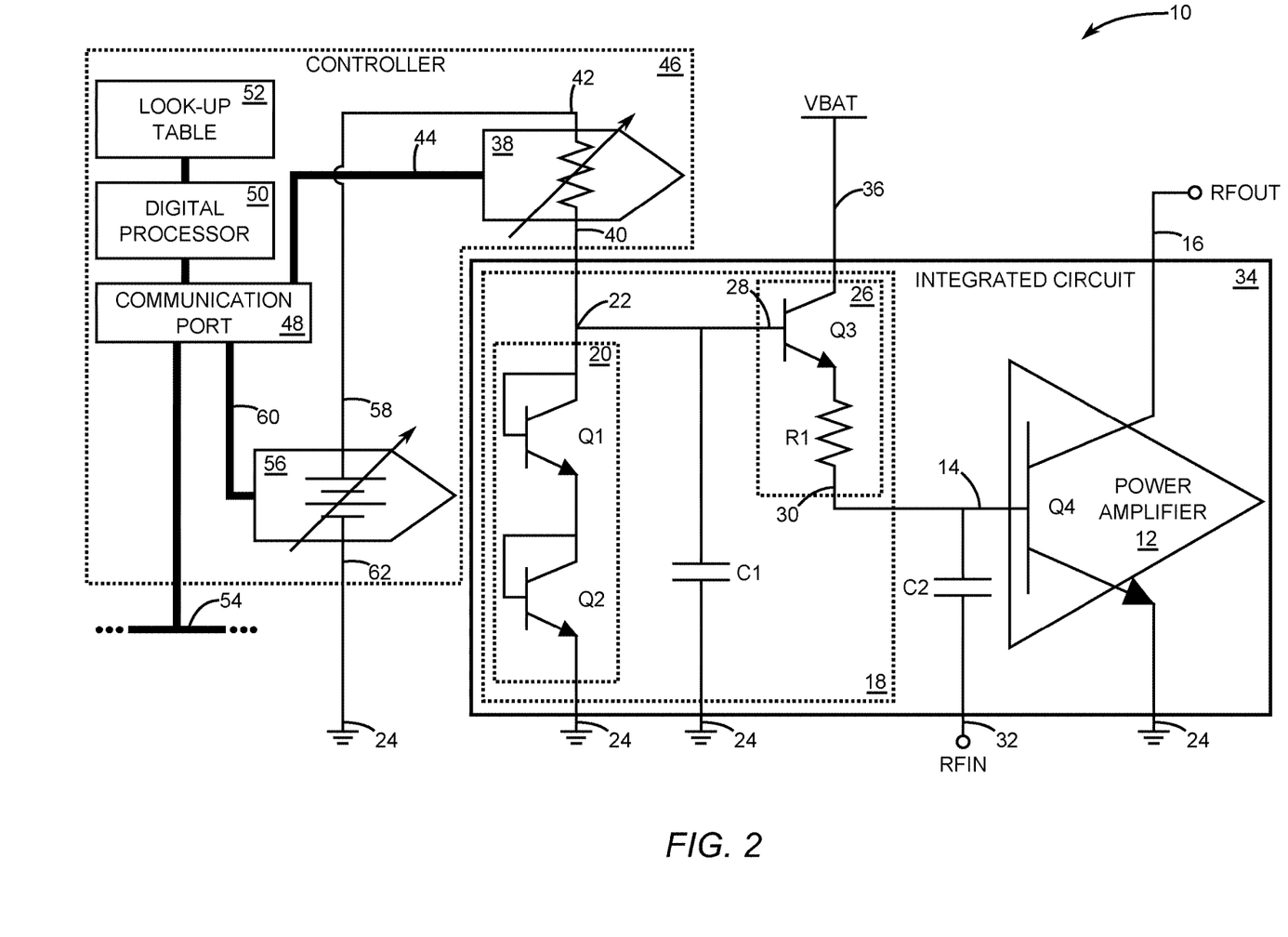
FIG. 2 is a schematic of a second exemplary embodiment of the power amplifier system that is structured in accordance with the present disclosure.

FIG. 2 is a schematic of a second exemplary embodiment of the power amplifier system 10 that is structured in accordance with the present disclosure. This second exemplary embodiment further includes a second digital-to-analog converter 56 that replaces the fixed voltage source VDC1. The second digital-to-analog converter 56 has a second analog output 58 coupled to the first analog input 42 of the first analog-to-digital converter 38, and a second digital input 60 coupled to the communication port 48. A second analog input 62 is coupled to the fixed voltage node 24.

During operation of the exemplary embodiment of FIG. 2, the digital processor 50 receives information passed through the communication port 48 from the communication bus 54, wherein the information is indicative of a current temperature of the power amplifier 12. Generally, the look-up table 52 has a list of data entries indicative of temperatures expected to be experienced by the power amplifier 12 versus first digital settings and second digital settings for the first digital-to analog converter 38 and the second digital-to analog converter 56, respectively. The data entries indicative of temperatures expected to be experienced by the power amplifier 12 may be power level settings for the power amplifier 12 that individually correspond to the data entries indicative of temperatures expected to be experienced by the power amplifier 12. In this case, the look-up table 52 has a first list of power level settings versus first digital settings for the first digital-to-analog converter 38 and the same list as a second list of power level settings versus second digital settings for the second digital-to-analog converter 56.

In response to a received current power level setting, the digital processor 50 retrieves from the look-up table a corresponding first digital setting and passes the first digital setting through the communication port 48 to the first digital input 44 of the first digital-to-analog converter 38. In response, the first digital-to-analog converter 38 adjusts the reference voltage at the reference node 22 in response to the first digital setting received at the first digital input 44. The digital processor 50 further retrieves from the look-up table a corresponding second digital setting and passes the second digital setting through the communication port 48 to the second digital input 60 of the second digital-to-analog converter 56. In response, the second digital-to-analog converter 56 further adjusts the reference voltage at the reference node 22 in response to the second digital setting received at the second digital input 60. As a result of both adjustments of the reference voltage, the bias signal generated by the bias circuitry 18 and applied to the signal input 14 of the power amplifier 12 is at a further corrected level to ensure that the gain of the power amplifier 12 remains appropriate for the current temperature of the power amplifier 12. The desired range for the gain of the amplifier 12 is predetermined to prevent unacceptable distortion of the RF signal being amplified by the power amplifier 12.

In this exemplary embodiment of FIG. 2, the first digital-to-analog converter 38 and the second digital-to-analog converter 56 are integrated with the controller 46. Moreover, in this exemplary embodiment, the first digital-to-analog converter 38 is a resistance-type digital-to-analog converter and the second digital-to-analog converter 56 is a voltage-type digital-to-analog converter.

Figure 3:
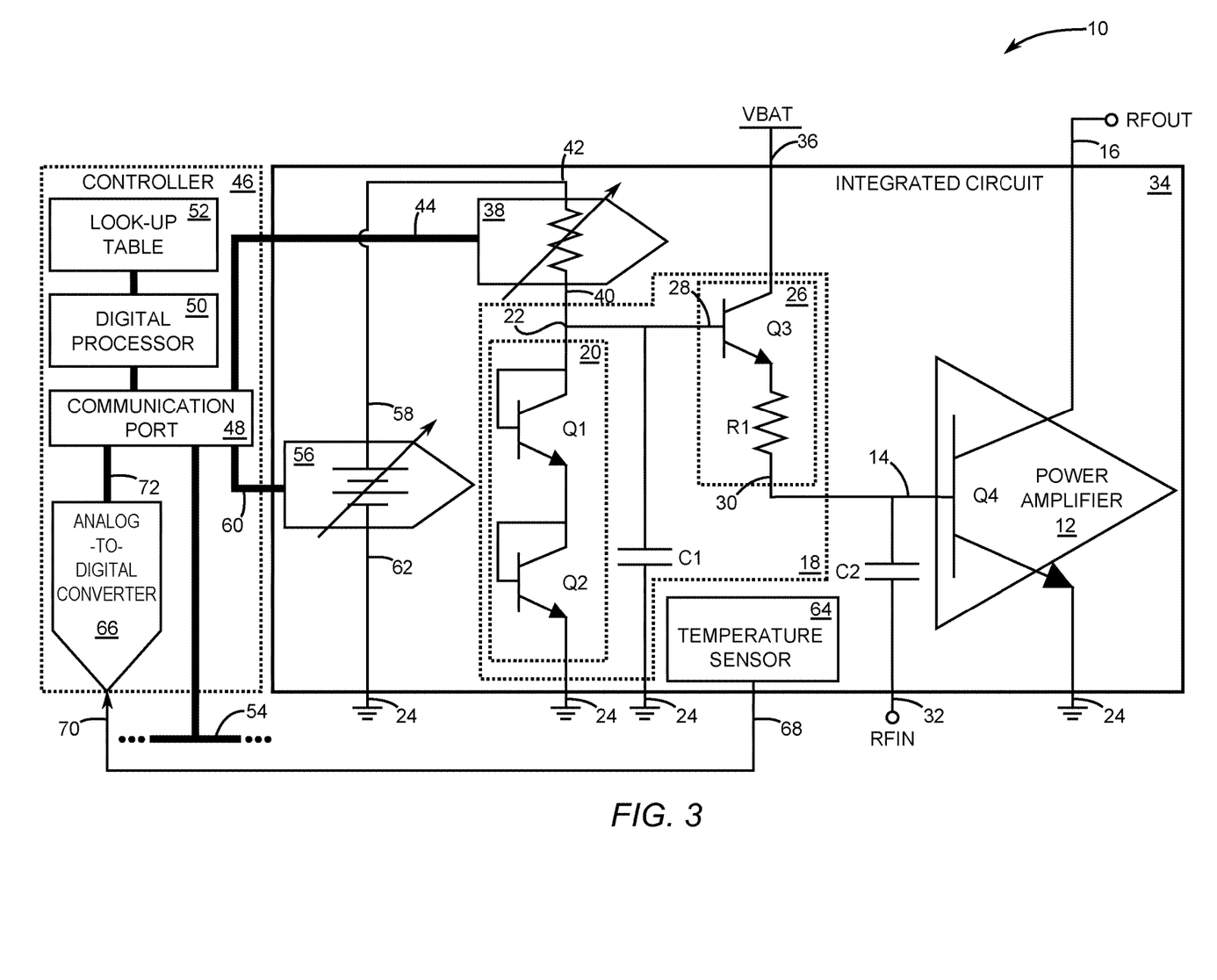
FIG. 3 is a schematic of a third embodiment of a power amplifier system of that is structured in accordance with the present disclosure.

FIG. 3 is a schematic of a third exemplary embodiment of the power amplifier system 10 that is structured in accordance with the present disclosure. This third exemplary embodiment further includes a temperature sensor 64 that is integrated with the power amplifier 12 within the integrated circuit 34. Also further included is an analog-to-digital converter 66 that can be either integrated into the integrated circuit 34 or integrated with the controller 46. A sensor output 68 of the temperature sensor 64 is coupled to a sensor input 70 of the analog-to-digital converter 66. The communication port 48 is coupled to a digital output 72 of the analog-to-digital converter 66. Notice that in this exemplary embodiment, both the first digital-to-analog converter 38 and the second digital-to-analog converter 56 are integrated into the integrated circuit 34.

During operation of the exemplary embodiment of FIG. 3, the digital processor 50 receives a digital temperature reading passed through the communication port 48 from the analog-to-digital converter 66, wherein the information is indicative of a current temperature of the power amplifier 12. In this case, the look-up table 52 has a list of temperature readings versus first digital settings for the first digital-to-analog converter 38 and the same list of temperature readings versus second digital settings for the second digital-to-analog converter 56.

In response to a received digital temperature reading, the digital processor 50 retrieves from the look-up table a corresponding first digital setting and passes the first digital setting through the communication port 48 to the first digital input 44 of the first digital-to-analog converter 38. In response, the first digital-to-analog converter 38 adjusts the reference voltage at the reference node 22 in response to the first digital setting received at the first digital input 44. The digital processor 50 further retrieves from the look-up table a corresponding second digital setting and passes the second digital setting through the communication port 48 to the second digital input 60 of the second digital-to-analog converter 56. In response, the second digital-to-analog converter 56 further adjusts the reference voltage at the reference node 22 in response to the second digital setting received at the second digital input 60. As a result of both adjustments of the reference voltage, the bias signal generated by the bias circuitry 18 and applied to the signal input 14 of the power amplifier 12 is at a further corrected level to ensure that the gain of the power amplifier 12 remains within a desired range for the current temperature of the power amplifier 12. The desired range for the gain of the amplifier 12 is predetermined to prevent unacceptable distortion of the RF signal being amplified by the power amplifier 12.

In yet another operation mode of the exemplary embodiment of FIG. 3, further information, such as a current power level setting can be received from the communication bus 54 through the communication port 48. In this case, the look-up table further includes a first list of power level settings and temperature readings versus first digital settings for the first digital-to-analog converter 38 and the same list as a second list of power level settings and temperature readings versus second digital settings for the second digital-to-analog converter 56.

In response to a received current power level setting and a received current temperature reading, the digital processor 50 retrieves from the look-up table 52 a corresponding first digital setting and passes the first digital setting through the communication port 48 to the first digital input 44 of the first digital-to-analog converter 38. The first digital-to-analog converter 38 then adjusts the reference voltage at the reference node 22 in response to the first digital setting received at the first digital input 44. The digital processor 50 further retrieves from the look-up table a corresponding second digital setting and passes the second digital setting through the communication port 48 to the second digital input 60 of the second digital-to-analog converter 56. The second digital-to-analog converter 56 further adjusts the reference voltage at the reference node 22 in response to the second digital setting received at the second digital input 60. As a result of both adjustments of the reference voltage, the bias signal generated by the bias circuitry 18 and applied to the signal input 14 of the power amplifier 12 is at a further corrected level to ensure that the gain of the power amplifier 12 remains appropriate for the current power setting and current temperature of the power amplifier 12. The desired range for the gain of the amplifier 12 is predetermined to prevent unacceptable distortion of the RF signal being amplified by the power amplifier 12.

Figure 4:
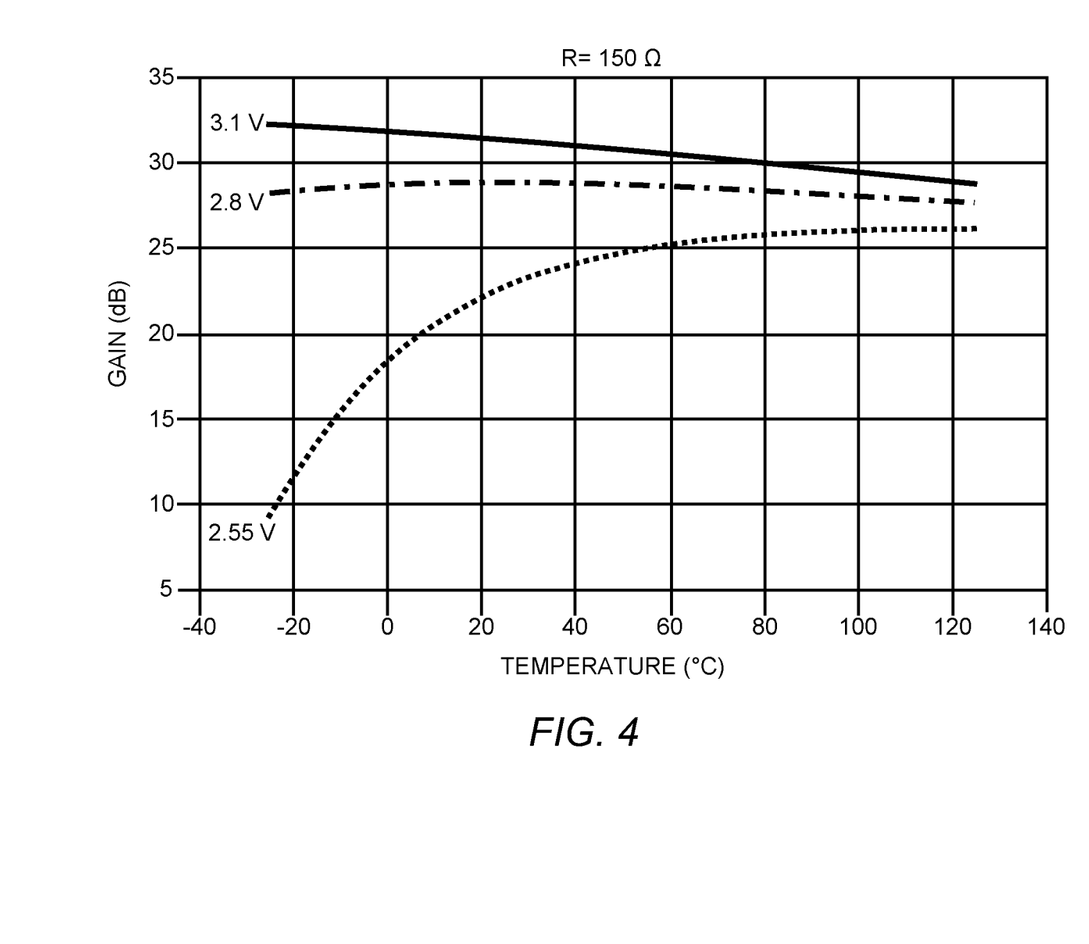
FIG. 4 is a graph depicting gain of a power amplifier of the power amplifier system as a function of temperature for exemplary voltages applied to a reference node of bias circuitry that provides a bias signal to the power amplifier when a resistance of a first digital-to-analog converter coupled to the reference node is set to a resistance value of 150Ω.

FIG. 4 is a graph depicting gain as a function of temperature for exemplary voltages applied to the reference node 22 of the bias circuitry 18 that provides the bias signal to the power amplifier 12 when the resistance between the first analog input 42 and the first analog output 40 of the first digital-to-analog converter 38 is set to a resistance value of 150Ω. Notice that in this case the gain is relatively flat for a reference voltage of 2.8 V at the reference node 22 over a wide range of temperatures in comparison to a lower reference voltage of 2.55 V and a higher reference voltage of 3.1 V. Thus, the first digital-to-analog converter 38 and the second digital-to-analog converter 56 depicted in FIGS. 2 and 3 can be controlled by the controller 46 to maintain the resistance coupled to the reference node at 150Ω while maintaining a reference voltage VREF at 2.8 V for temperatures between −40° C. and 140° C. The graph of FIG. 4 also illustrates why the first digital-to-analog converter 38 is a resistance-type digital-to-analog converter used to correct quiescent current level associated with current biasing.

Figure 5:
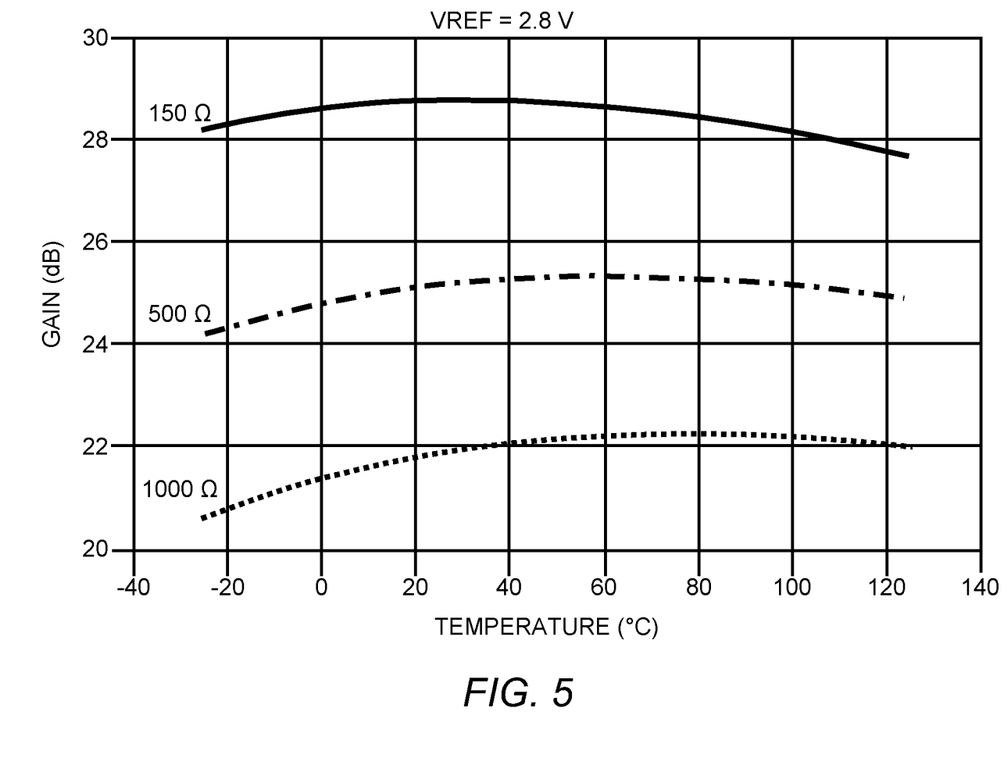
FIG. 5 is a graph depicting gain for the power amplifier as a function of temperature for exemplary resistance values of the first analog-to-digital converter coupled to the reference node of the bias circuitry for a fixed reference voltage of 2.8 V.

FIG. 5 is a graph depicting gain for the power amplifier 12 as a function of temperature for exemplary resistance values for the first analog-to-digital converter 38 coupled to the reference node 22 of the bias circuitry 18 for a fixed reference voltage of 2.8 V. Notice that the gain of the power amplifier 12 is relatively flat with the resistance of the first analog-to-digital converter set to any of 150 Ω, 500Ω, and 1000Ω over a wide range of temperatures. However, also notice that the gain of the power amplifier 12 is above 27 dB for the 150Ω value in comparison to the higher resistance value of 500Ω with gain that is less than 26 dB and the yet higher resistance value of 1000Ω with gain that is less than 23 dB. Thus, the first digital-to-analog converter 38 and the second digital-to-analog converter 56 depicted in FIGS. 2 and 3 can be controlled by the controller 46 to maintain a relatively high gain for the amplifier 12 for temperatures between −40° C. and 140° C. by controlling both current biasing and voltage biasing as a function of indicated temperature of the power amplifier 12.

Figure 6:
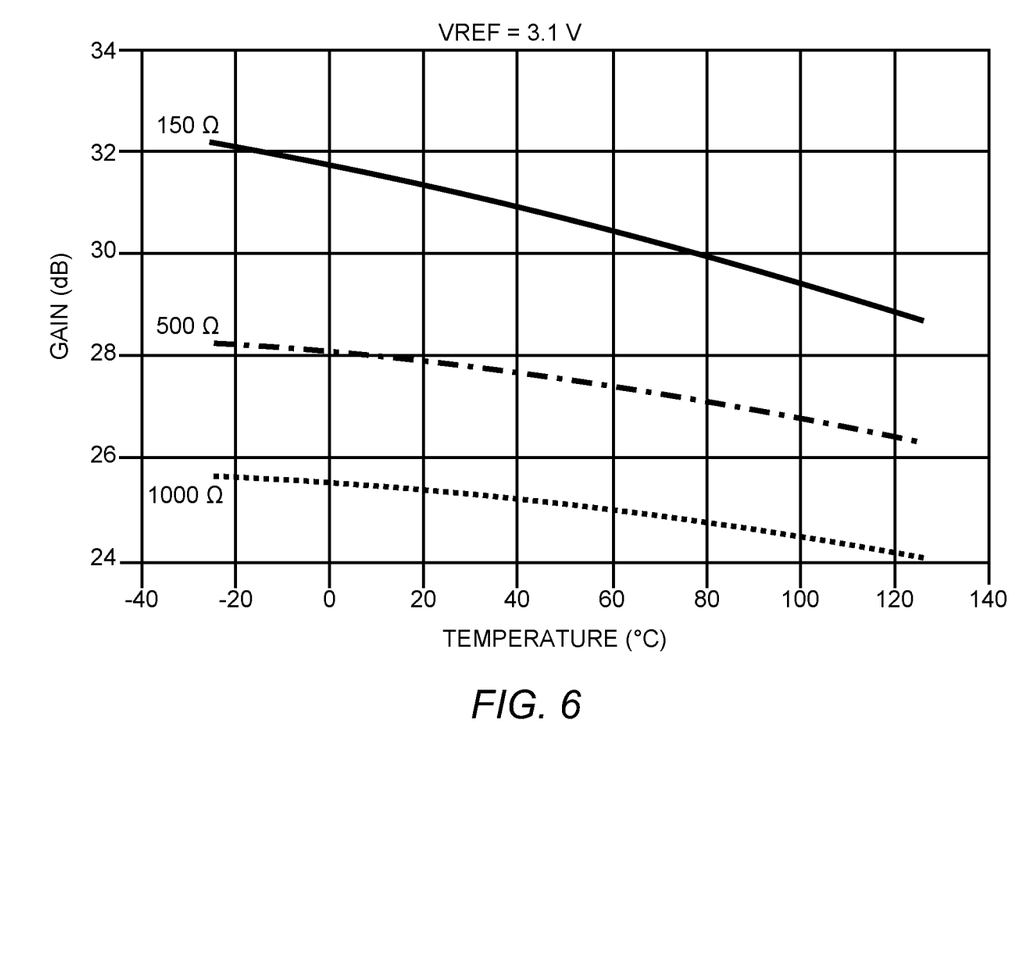
FIG. 6 is a graph depicting gain for the power amplifier as a function of temperature for exemplary resistance values of the first analog-to-digital converter coupled to the reference node of the bias circuitry for a fixed reference voltage of 3.1 V.

FIG. 6 is a graph depicting gain for the power amplifier 12 as a function of temperature for exemplary resistance values for the first analog-to-digital converter 38 coupled to the reference node 22 of the bias circuitry 18 for a fixed reference voltage of 3.11 V. Notice that with the higher fixed reference voltage of 3.11 V, the gain of the power amplifier 12 is no longer relatively flat with the resistance of the first analog-to-digital converter set to any of 150 Ω, 500Ω, and 1000Ω over the wide range of temperatures between −40° C. and 140° C. The graph of FIG. 6 also illustrates why the second digital-to-analog converter 56 is a voltage-type digital-to-analog converter used to correct temperature coefficients associated with voltage biasing.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
a power amplifier having a signal input and a signal output;
bias circuitry comprising:
a bandgap reference circuit coupled between a reference node and a fixed voltage node; and
a bias generator having a bias input coupled to the reference node and a bias output coupled to the signal input;
a first digital-to-analog converter having a first analog output coupled to the reference node, a first analog input, and a first digital input, wherein the first digital-to-analog converter is configured to adjust a reference voltage at the reference node in response to a first digital setting received at the first digital input; and
a controller comprising:
a communication port in communication with the first digital input of the first digital-to-analog converter; and
a digital processor in communication with the communication port, wherein the digital processor is configured to:
receive a current indication of temperature of the power amplifier through the communication port;
generate the first digital setting correlating with the current indication of temperature of the power amplifier; and
send the first digital setting through the communication port to the first digital input of the first digital-to-analog converter.

2. The power amplifier system of claim 1 further comprising a look-up table having a list of data entries indicative of temperatures expected to be experienced by the power amplifier versus first digital settings for the first digital-to-analog converter, wherein the look-up table is in communication with the digital processor and the digital processor is further configured to retrieve from the look-up table the first digital setting corresponding to the current indication of temperature of the power amplifier.

3. The power amplifier system of claim 2 further comprising a second digital-to-analog converter having a second analog output coupled to the first analog input, a second analog input coupled to a fixed voltage node, and a second digital input, wherein the second digital-to-analog converter is configured to adjust a voltage at the first analog input in response to a second digital setting received at the second digital input.

4. The power amplifier system of claim 3 wherein the look-up table further includes second digital settings for the second digital-to-analog converter corresponding with the list of data entries indicative of temperatures expected to be experienced by the power amplifier, and wherein the digital processor is further configured to retrieve from the look-up table the second digital setting corresponding to the current indication of temperature of the power amplifier.

5. The power amplifier system of claim 4 wherein the list of data entries indicative of temperatures expected to be experienced by the power amplifier comprises power level settings for the power amplifier.

6. The power amplifier system of claim 4 wherein the power amplifier and bias circuitry are integrated in an integrated circuit.

7. The power amplifier system of claim 6 further comprising:
   an analog-to-digital converter having a digital output coupled to the communication port and a sensor input; and
   a temperature sensor integrated in the integrated circuit and a sensor output coupled to the sensor input, wherein the analog-to-digital converter is configured to convert an analog temperature generated by the temperature sensor to a digital temperature reading that is sent from the digital output to the communication port as the indication of the current temperature of the power amplifier.

8. The power amplifier system of claim 6 wherein the first digital-to-analog converter and the second digital-to-analog converter are integrated with the power amplifier and bias circuitry in the integrated circuit.

9. The power amplifier system of claim 7 wherein the first digital-to-analog converter, the second digital-to-analog converter, and the temperature sensor are integrated with the power amplifier and bias circuitry in the integrated circuit.

10. The power amplifier system of claim 1 wherein the first digital-to-analog converter has a variable resistance between the first analog input and the first analog output, wherein the variable resistance is controlled by the first digital-to-analog converter in response to the first digital setting received at the first digital input.

11. The power amplifier system of claim 3 wherein the second digital-to-analog converter has a variable voltage at the second analog output, wherein the variable voltage is controlled by the second digital-to-analog converter in response to the second digital setting received at the first digital input.

12. The power amplifier system of claim 1 further including a filter capacitor coupled between the reference node and ground.

13. The power amplifier system of claim 1 further including a coupling capacitor coupled between a radio frequency input and the signal input of the power amplifier.

14. The power amplifier system of claim 1 wherein a gain of the power amplifier remains within ±1 dB over a temperature range between −40° C. and 140° C.

15. The power amplifier system of claim 1 wherein the power amplifier is based on bipolar junction transistor technology.

16. The power amplifier system of claim 1 wherein the bandgap reference circuit comprises a pair of stacked transistors that are each in a diode configuration coupled between the reference node and the fixed voltage node.

17. The power amplifier system of claim 1 wherein the fixed voltage node is ground.

18. The power amplifier system of claim 1 wherein the bias generator comprises a bipolar junction transistor having a base coupled to the bias input and an emitter coupled to the signal input of the power amplifier.

19. The power amplifier system of claim 18 wherein the bias generator further comprises a resistor coupled between the emitter and the signal input of the power amplifier.

* * * * *